(12) United States Patent  (10) Patent No.: US 9,502,564 B2
Moll et al.  (45) Date of Patent: Nov. 22, 2016

(54) FULLY DEPLETED DEVICE WITH BURIED INSULATING LAYER IN CHANNEL REGION

(71) Applicant: GLOBALFOUNDRIES Inc., Grand Cayman (KY)

(72) Inventors: Hans-Peter Moll, Dresden (DE); Peter Baars, Dresden (DE); Jan Hoentschel, Dresden (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/164,374

(22) Filed: May 25, 2016

(65) Prior Publication Data

US 2016/0268431 A1  Sep. 15, 2016

Related U.S. Application Data

(62) Division of application No. 14/521,939, filed on Oct. 23, 2014, now Pat. No. 9,385,232.

(51) Int. Cl.
| | |
|---|---|
| *H01L 29/10* | (2006.01) |
| *H01L 29/76* | (2006.01) |
| *H01L 31/036* | (2006.01) |
| *H01L 31/112* | (2006.01) |
| *H01L 29/78* | (2006.01) |
| *H01L 29/08* | (2006.01) |
| *H01L 29/161* | (2006.01) |
| *H01L 29/165* | (2006.01) |
| *H01L 29/06* | (2006.01) |

(52) U.S. Cl.
CPC ....... *H01L 29/7848* (2013.01); *H01L 29/0649* (2013.01); *H01L 29/0847* (2013.01); *H01L 29/161* (2013.01); *H01L 29/165* (2013.01); *H01L 29/7838* (2013.01)

(58) Field of Classification Search
USPC ....... 438/424, 318, 301, 96; 257/66, 67, 347
See application file for complete search history.

(56) References Cited

U.S. PATENT DOCUMENTS

| | | |
|---|---|---|
| 2004/0164298 A1 | 8/2004 | Hiramatsu et al. |
| 2008/0121985 A1 | 5/2008 | Chen et al. |
| 2008/0157092 A1 | 7/2008 | Arai et al. |
| 2009/0243031 A1 | 10/2009 | Natzle et al. |
| 2010/0221867 A1 | 9/2010 | Bedell et al. |

*Primary Examiner* — Telly Green
(74) *Attorney, Agent, or Firm* — Amerson Law Firm, PLLC

(57) ABSTRACT

A semiconductor device includes an active region formed in a semiconductor substrate, a gate structure disposed over the active region, source/drain regions formed in the active region in alignment with the gate structure, and a buried insulating material region disposed in the active region under the gate structure. The buried insulating material region is surrounded by the active region and borders a channel region in the active region below the gate structure along a depth of the active region. The source/drain regions have a depth greater than a top surface of the buried insulating material region.

15 Claims, 5 Drawing Sheets

FULLY DEPLETED DEVICE WITH BURIED INSULATING LAYER IN CHANNEL REGION

BACKGROUND OF THE INVENTION

1. Field of the Invention

The present disclosure generally relates to fully depleted (FD) devices in advanced semiconductor techniques and, more particularly, to semiconductors devices having fully depleted channels with a buried insulating layer.

2. Description of the Related Art

In modern electronic technologies, integrated circuits (ICs) experience a vast applicability in a continuously spreading range of applications. Particularly, the ongoing demand for increasing mobility of electronic devices at high performance and low energy consumption drives developments to more and more compact devices having features with sizes significantly smaller than one micrometer, the more so as current semiconductor technologies are apt of producing structures with dimensions in the magnitude of 100 nm or less. With ICs representing a set of electronic circuit elements integrated on a semiconductor material, normally silicon, ICs can be made much smaller than any discreet circuit composed of independent circuit components. Indeed, the majority of present-day ICs are implemented by using a plurality of circuit elements, such as field effect transistors (FETs), also called metal oxide semiconductor field effect transistors (MOSFETs or simply MOS transistors), and passive elements, such as resistors and capacitors, integrated on a semiconductor substrate with a given surface area, wherein typical present-day ICs involve millions of single circuit elements formed on a semiconductor substrate.

The basic function of a FET is that of an electronic switching element, wherein a current through a channel region formed between two junction regions, referred to as source and drain, is controlled by a gate electrode, which is disposed over the channel region and to which a voltage relative to source and drain is applied. In common FETs, the channel region extends along a plane between the source and drain regions, such FETs also being referred to as "planar FETs." Generally, in applying a voltage exceeding a characteristic voltage level to the gate electrode, the conductivity state of the channel is changed and switching between a conducting state or "ON state" and a non-conducting state or "OFF state" may be achieved. It is important to note that the characteristic voltage level at which the conductivity state changes (usually called "the threshold voltage") therefore characterizes the switching behavior of the FET. In fact, it is an ongoing issue in present semiconductor fabrication to keep variations in the threshold value level low for implementing a well-defined switching characteristic. However, as the threshold voltage depends nontrivially on the transistor's properties, e.g., materials, dimensions, etc., the implementation of a desired threshold voltage value during fabrication processes involves careful adjustment and fine-tuning during the fabrication process, which makes the fabrication of advanced semiconductor devices increasingly complex.

The continued miniaturization of semiconductor devices in the deep sub-micron regime becomes more and more challenging with smaller dimensions. One of the several manufacturing strategies employed herein is the implementation of SOI technologies. SOI (silicon-on-insulator) refers to the use of a layered silicon-insulator-silicon substrate in place of conventional silicon substrates in semiconductor manufacturing, especially micro-electronics, to reduce parasitic device capacitance and short channel effects, thereby, improving performance. Semiconductor devices on the basis of SOI differ from conventional semiconductor devices formed on a bulk substrate in that the silicon junction is formed above an electrical insulator, typically silicon dioxide or sapphire (these types of devices are called silicon-on-sapphire or SOS devices). The choice of insulator depends largely on the intended application, with sapphire being usually employed in high performance radio frequency applications and radiation-sensitive applications, and silicon dioxide providing for diminished short channel effects in microelectronic devices.

In general, a conventional SOI-based semiconductor device comprises a semiconductor layer, e.g., based on silicon and/or germanium, being formed on an insulating layer, e.g., silicon dioxide, which is a so-called buried oxide (BOX) layer formed on a semiconductor substrate. From a physical point of view, the very thin semiconductor film over the BOX layer enables the semiconductor material under the transistor gate, i.e., in the channel region of the semiconductor device, to be fully depleted of charges. The net effect is that the gate can now very tightly control the full volume of the transistor body. Accordingly, an SOI device is much better behaved than a bulk device, especially because the supply voltage, i.e., the gate voltage, gets lower and device dimensions are allowed to be scaled.

Basically, there are two types of SOI devices: PDSOI (partially depleted SOI) and FDSOI (fully depleted SOI) devices. For example, in an N-type PDSOI device, a P-type film is sandwiched between a gate oxide (GOX) layer and the buried oxide (BOX) layer which is to be large, such that the depletion region does not cover the whole channel region. Therefore, PDSOI devices behave to some extent like bulk semiconductor devices.

A major problem, particularly in PDSOI, is the so-called "floating body effect" (FBE), which appears because the semiconductor film over the BOX layer is not connected to any of the supplies.

In FDSOI devices, the semiconductor film between the GOX layer and the BOX layer is very thin, such that the depletion region substantially covers the whole semiconductor film. Herein, the GOX layer supports less depletion charges than in bulk applications, and, accordingly, an increase in inversion charges is caused, resulting in higher switching speeds. Additionally, FDSOI devices do in general not require any doping of the channel region. In FDSOI, drawbacks of bulk semiconductor devices, like threshold voltage roll off, higher subthreshold slop body effect, short channel effect, etc., are reduced. The reason is that source and drain electric fields cannot interfere due to the BOX layer bordering the very thin semiconductor film along a depth direction of the SOI substrate.

Current semiconductor devices on the basis of SOI include a silicon layer of 5-10 nm thickness formed on a BOX layer with a thickness of about 145 nm.

Further scaling of SOI devices for fabricating semiconductor devices of the next generation raises new problems and challenges. For example, when reaching the next technology node, the thickness of the channel region has to be further reduced, turning out to be critical in current semiconductor technologies. However, the relaxing of the semiconductor channel raises new constraints on a thickness of the semiconductor film and of the BOX layer because of issues relating to the electrostatic control of strongly scaled SOI devices.

Accordingly, it is desirable to provide a semiconductor device which partially overcomes at least one of the above-mentioned issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one aspect of the present disclosure, a semiconductor device includes an active region formed in a semiconductor substrate, a gate structure disposed over the active region, source/drain regions formed in the active region in alignment with the gate structure, and a buried insulating material region disposed in the active region under the gate structure. The buried insulating material region is surrounded by the active region and borders a channel region in the active region below the gate structure along a depth of the active region. The source/drain regions have a depth greater than a top surface of the buried insulating material region.

In another aspect of the present disclosure, a semiconductor device includes an active region formed in a semiconductor substrate, a gate structure disposed over the active region, source/drain regions formed within the active region in alignment with the gate structure, and a buried insulating material region disposed in the active region under the gate structure at a depth out of a range from about 10-20 nm in the active region, wherein the insulating material region laterally abuts against the source/drain regions and defines a lateral separation between the source/drain regions of about at most 40 nm. The source/drain regions have a depth greater than a top surface of the buried insulating material region.

In yet another aspect of the present disclosure, a semiconductor device includes an active region formed in a semiconductor substrate, a gate structure disposed over the active region, spacers defined on sidewalls of the gate structure, source/drain regions formed within the active region in alignment with the gate structure, and a buried insulating material region disposed in the active region under the gate structure. The buried insulating material region is surrounded by the active region. Edges of the buried insulating material region disposed adjacent the source/drain regions are disposed beneath the spacers. The source/drain regions have a depth greater than a top surface of the buried insulating material region.

BRIEF DESCRIPTION OF THE DRAWINGS

The disclosure may be understood by reference to the following description taken in conjunction with the accompanying drawings, in which like reference numerals identify like elements, and in which.

Figure 1:
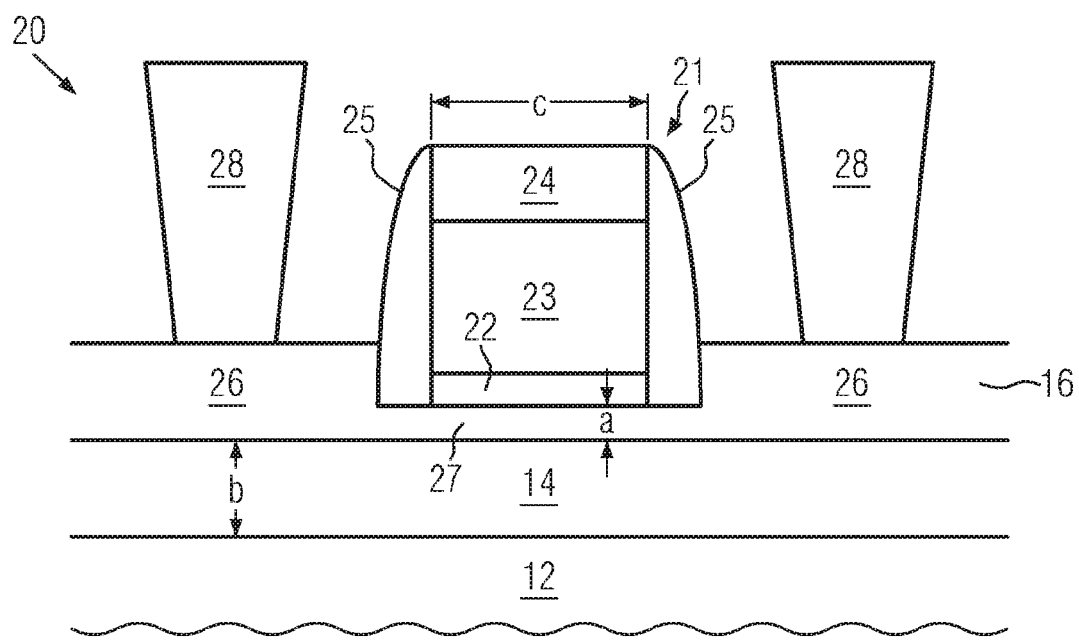
FIG. 1 illustrates, in cross-sectional view, a conventional SOI device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to semiconductor circuit elements comprising semiconductor devices that are integrated on or in a chip, such as FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor circuit elements of the present disclosure, and particularly semiconductor devices as illustrated by means of some illustrative embodiments, concern elements and devices which are fabricated by using advanced technologies. Semiconductor circuit elements of the present disclosure are fabricated by technologies applied to approach technology nodes smaller than 100 nm, for example, smaller than 50 nm or smaller than 35 nm, i.e., ground rules smaller or equal to 45 nm may be imposed. The person skilled in the art will appreciate that the present disclosure suggests semiconductor circuit elements having structures with minimal length and/or width dimensions smaller than 100 nm, for example smaller than 50 nm or smaller than 35 nm. For example, the present disclosure may provide for semiconductor devices fabricated by using 45 nm technologies or below, e.g., 28 nm or below.

The person skilled in the art understands that semiconductor devices may be fabricated as MOS devices, such as P-channel MOS transistors or PMOS transistors and N-channel transistors or NMOS transistors, and both may be fabricated with or without mobility-enhancing stressor features or strain-inducing features. A circuit designer can mix and match device types, using PMOS and NMOS devices, stressed and unstressed, to take advantage of the best characteristics of each device type as they best suit the semiconductor circuit element being designed.

With regard to FIG. 1, a conventional SOI device 20 will be described. The SOI device 20 comprises a gate structure 21 formed on and above a semiconductor material layer 16 which is disposed on a buried oxide layer 14 and a substrate 12.

The gate structure 21 is formed by a gate oxide 22, a gate electrode 23 disposed on the gate oxide 22 and a gate contact 24 formed on the gate electrode 23. At laterally opposing sides of the gate electrode 23, sidewall spacers 25 are present for adjusting a separation of source/drain regions 26 to the gate electrode 23. Herein, the source/drain regions 26 are implemented as so-called raised source/drain regions. The gate oxide 22 is disposed on the semiconductor layer 16 such that a channel region 27 is formed in between the gate oxide 22 and the buried oxide layer 14. Furthermore, contacts 28 are formed in contact with the source/drain regions 26.

In FIG. 1, a depth of the channel region 27 is denoted by double-arrow a, a depth of the buried oxide layer 14 is denoted by double-arrow b and a length of the gate electrode 23, which extends between the source/drain regions 26, is indicated by double-arrow c.

In accordance with conventional techniques, the inventors manufactured the SOI device 20 having a length c of 25 nm at a channel depth of a=6 nm and a thickness b of the buried oxide layer 14 of about 25 nm. However, the SOI device 20, though having an ultrathin buried oxide layer 14, shows several drawbacks, such as an unsatisfactory device performance and a poor electrostatic control.

In order to improve the device performance and the electrostatic control, it is proposed to provide a buried insulating material layer instead of the buried oxide layer 14, the buried insulating material layer being formed with a thickness which may be substantially smaller than b of the buried oxide layer 14 and, opposed to the thickness b of the buried oxide layer 14, may be variable.

Figure 2A:
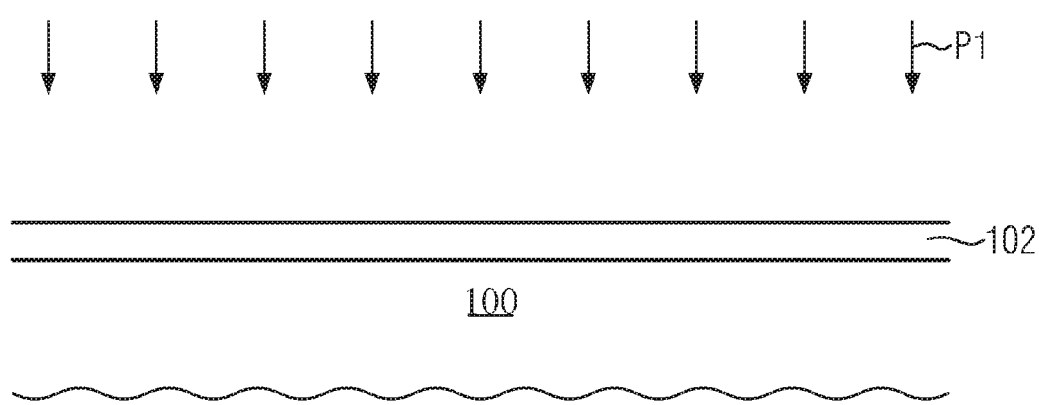
FIGS. 2a-2l schematically illustrate, in cross-sectional views, a process flow in accordance with various illustrative embodiments of the present disclosure, wherein a semiconductor device in accordance with some illustrative embodiments of the present disclosure is formed.

In the following, various illustrative embodiments of the present disclosure will be described with regard to FIGS. 2a-2l. Referring to FIG. 2a, a process flow for fabricating semiconductor devices is schematically illustrated at an early stage during fabrication, i.e., at an early phase during front end of line (FEOL) processing. Herein, a semiconductor substrate 100, such as a silicon bulk substrate or germanium substrate or silicon germanium substrate, is provided.

Subsequently, an insulating material layer 102 may be formed on the semiconductor substrate 100. In some illustrative embodiments of the present disclosure, the insulating material layer 102 may be formed of silicon oxide material. For example, a thermal oxidation process, dry oxidation process or wet oxidation process of silicon material may be applied to the semiconductor substrate 100. Alternatively, silicon oxide material may be deposited, e.g., by silane pyrolysis or TEOS deposition.

In accordance with some illustrative embodiments of the present disclosure, the insulating material layer 102 may have a thickness of about 10 nm. Alternatively, more than one thickness may be formed, e.g., multiple thicknesses.

Figure 2B:
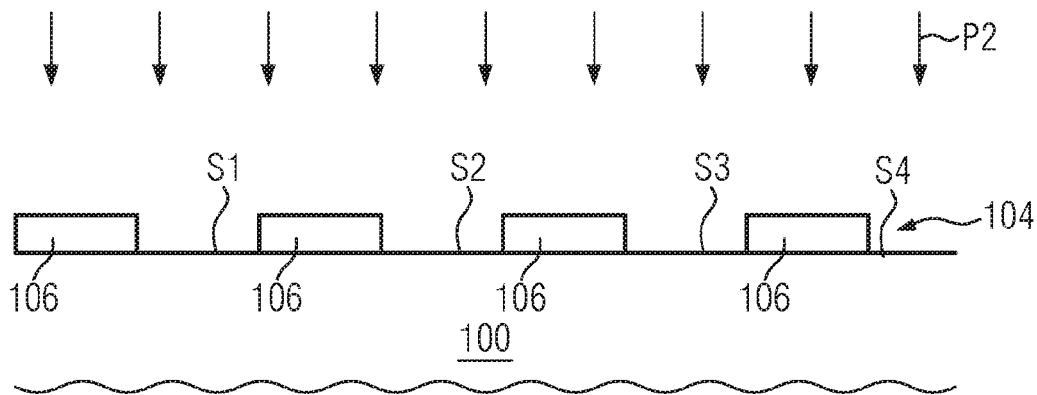

Next, i.e., after the formation of the insulating material layer 102, a process P1 may be performed for patterning the insulating material layer 102. In accordance with some illustrative embodiments of the present disclosure, the process P1 may further comprise a patterning sequence for forming a patterned insulating material layer 104, as illustrated in FIG. 2b. The patterned insulating material layer 104 comprises insulating material regions 106 which are formed on an upper surface of the semiconductor substrate 100 such that the upper surface of the semiconductor substrate 100 is partially covered by the patterned insulating material layer 104. That is, the patterned insulating material layer 104 covers surface portions of the upper surface by means of the insulating material regions 106, while leaving surface portions, such as S1-S4, of the upper surface of the semiconductor substrate 100 uncovered and, particularly, exposed to further processing.

In accordance with some illustrative embodiments of the present disclosure, the insulating material regions 106 may have a length dimension, i.e., a dimension along an extension between two adjacent portions S1 to S4, e.g., between S1 and S2, substantially smaller than 40 nm, e.g., 30 nm and smaller, or 28 nm and smaller.

Next, a process P2 may be performed. In accordance with some illustrative embodiments of the present disclosure, the process P2 may comprise a deposition process for depositing amorphous semiconductor material over the semiconductor substrate 100 and on the patterned insulating material layer 104.

Figure 2C:
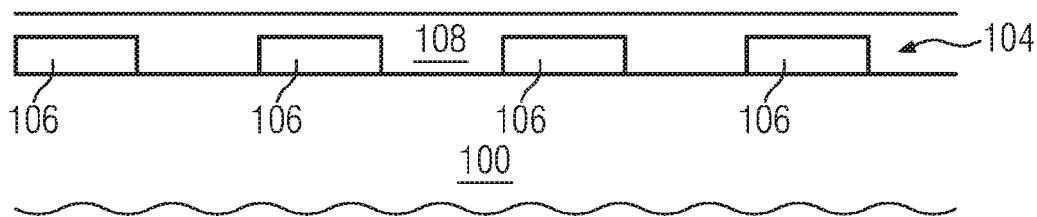

With regard to FIG. 2c, a stage during processing is schematically illustrated at which the process P2 of FIG. 2b is substantially completed. As a result of the process P2, a layer 108 of amorphous semiconductor material is formed on and above the semiconductor substrate 100 and the patterned insulating material layer 104. Herein, the insulating material regions 106 are substantially embedded from above into the layer 108 of amorphous semiconductor material. The person skilled in the art will appreciate that the insulating material regions 106 are partially enclosed by the layer 108 of amorphous semiconductor material. That is, a lower surface of the insulating material regions 106 is disposed on and in direct contact with the semiconductor substrate 100. In accordance with a preferred embodiment of the present disclosure, the layer 108 is deposited without forming an interface (typically an oxide) between the semiconductor substrate 100 and the layer 108. An interface as depicted in FIGS. 2c and 2d is to be understood as schematically indicating the presence of material of the deposited layer 108 against material of the semiconductor substrate 100, although an interface between the two layers may not even be observable.

In accordance with some illustrative embodiments herein, the amorphous semiconductor material of the layer 108 may be one of a doped material and an undoped material. In a special example, the layer 108 may be formed by amorphous silicon. Additionally or alternatively, the amorphous semiconductor material of the layer 108 may be a semiconductor material which comprises germanium, such as one of silicon germanium and pure germanium. The person skilled in the art will appreciate that a desired type of conductivity of the semiconductor material may be imposed, which semiconductor material partly surrounds the insulating material regions 106. Additionally or alternatively, a stressimposing material, such as a germanium comprising material, may be employed.

In accordance with some illustrative embodiments of the present disclosure, the layer 108 may have a thickness along a normal direction of the upper surface of the semiconductor substrate 100 of about 10-20 nm, i.e., along a depth direction of the semiconductor substrate 100.

Figure 2D:
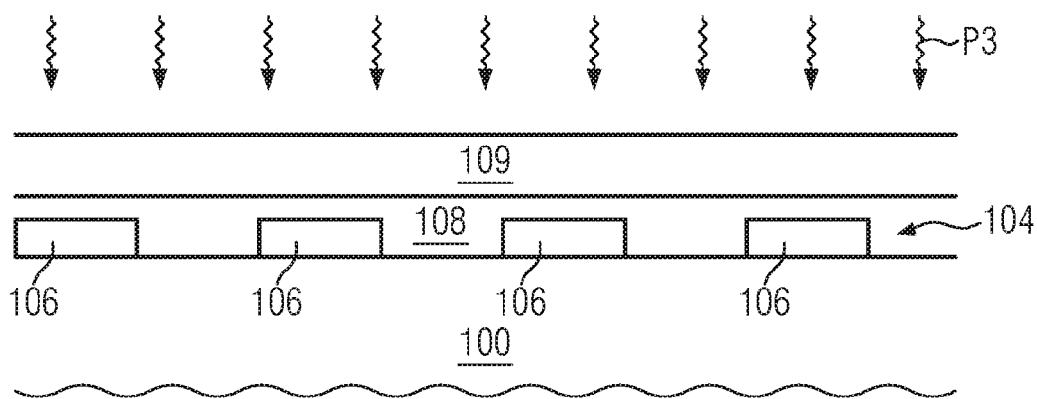

Next, as illustrated in FIG. 2d, a cap layer 109 may be formed over the layer 108 of amorphous semiconductor material. In some illustrative embodiments herein, the cap layer 108 may be formed by one of an oxide material and a nitride material. The person skilled in the art will appreciate that the formation of the cap layer 109 is optional and not limiting to the present disclosure. In accordance with illustrative embodiments of the present disclosure, the cap layer 109 may be omitted from above the layer 108 of amorphous semiconductor material. However, the person skilled in the art will appreciate that, upon forming the cap layer 109 over the layer 108 of amorphous semiconductor material, so-called "EP hillocks" may be avoided in subsequently performed growth processes using epitaxy methods.

Figure 2E:
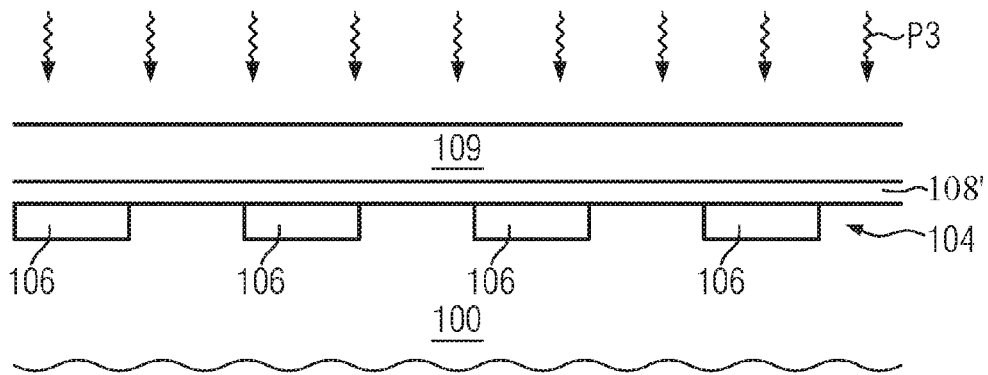
Figure 2F:
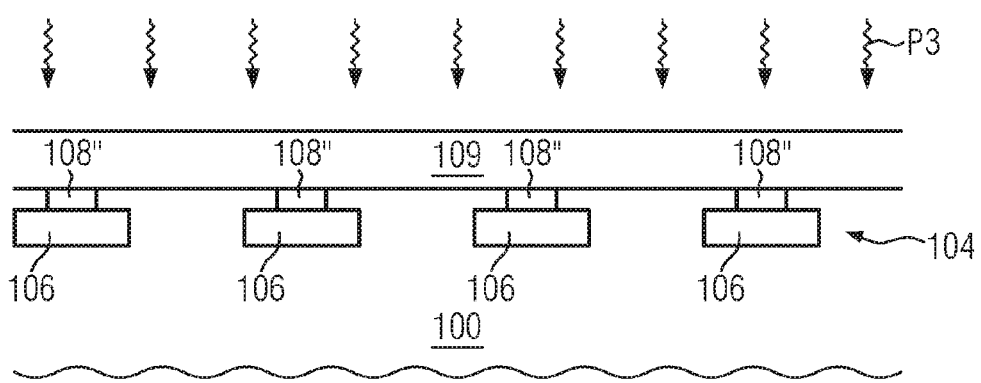

Next, as illustrated by means of FIGS. 2d, 2e and 2f, a process P3 may be performed. Herein, FIGS. 2d, 2e and 2f schematically illustrate, in cross-sectional views, a progress of the process P3 over time, wherein FIG. 2d schematically illustrates the semiconductor device at an early stage during the process P3, while FIG. 2e schematically illustrates the semiconductor device at an intermediate stage of the process P3, particularly at a point of time that is after a point of time corresponding to FIG. 2d, while FIG. 2f schematically illustrates the semiconductor device at a later stage during the process P3, particularly after the stage illustrated in FIG. 2e. As visible from the sequence of the FIGS. 2d, 2d and 2f, the layer 108 of amorphous semiconductor material is successively shrinking via the states as depicted in FIG. 2e by means of a shrunken layer 108' of amorphous semiconductor material to regions 108'' of amorphous semiconductor material towards the end of the process P3.

In accordance with some illustrative embodiments of the present disclosure, the process P3 may comprise an annealing step used to crystallize or heal semiconductor material of the semiconductor device and, particularly, the amorphous material of the layer 108. Herein, the semiconductor substrate 100, as being in a single crystal state, serves as a template for crystal growth such that the semiconductor substrate 100 grows by using epitaxy methods during the process P3 as schematically illustrated in FIGS. 2d, 2e and 2f over time. It is noted that the impurity segregation and redistribution at a growing interface between crystalline and amorphous material during the process P3 may be used to incorporate low solvable dopants in metals and silicon.

In accordance with some illustrative examples herein, the layer 108 of amorphous semiconductor material (FIG. 2d) is reshaped by the process P3 comprising solid phase epitaxy SPE. The person skilled in the art will appreciate that SPE is a special case of crystal growth where, under certain annealing conditions, atoms of an amorphous layer structurally reorder into a crystalline template layer by layer. The process P3 may accordingly include a furnace annealing under nonreactive gas (N2, H2 or Ar) atmosphere and the direct in situ annealing in the deposition vacuum chamber. Temperatures used may be in a range from 400-600° C. or in the range from 900-1200° C.

Figure 2G:
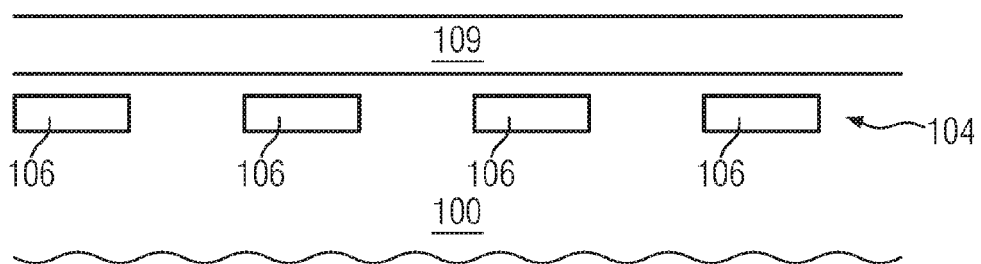
Figure 2H:
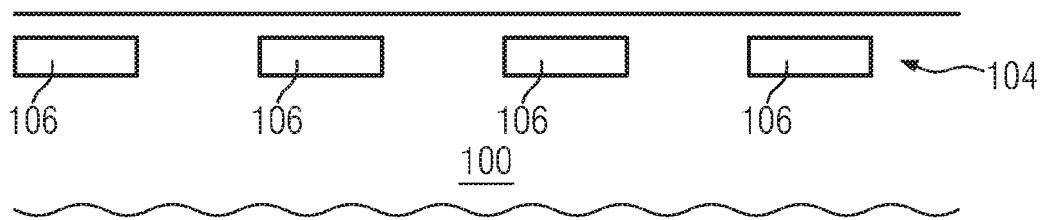

FIG. 2g schematically illustrates the semiconductor device after the process P3 is completed. Herein, the insulating material regions 106 are completely buried into the semiconductor substrate 100 such that each of the buried insulating material regions 106 is completely surrounded by semiconductor material of the semiconductor substrate 100.

In accordance with some illustrative embodiments of the present disclosure, the buried insulating material layer 104 may be buried to a depth of about 10-20 nm into the semiconductor substrate 100.

Next, the cap layer 109 in FIG. 2g may be removed by a wet etch process or a dry etch process or an appropriate stripping process (not illustrated). With regard to FIG. 2h, the semiconductor device is schematically illustrated after the cap layer 109 (FIG. 2g) is removed. Next, an optional cleaning process for cleaning the surface of the semiconductor device after removal of the cap layer may be performed, e.g., by performing a wet oxidation process and an etch process with DHF (not illustrated).

Figure 2I:
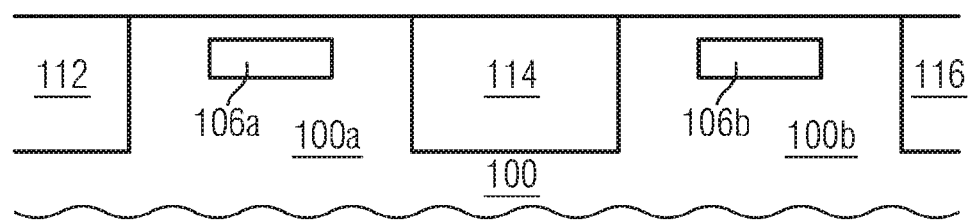

Referring to FIG. 2i, the semiconductor device is schematically illustrated at a subsequent phase during processing, particularly after the cap layer 109 (FIG. 2g) is removed and an (optional) surface cleaning (not illustrated) is performed. As illustrated, shallow trench insulation regions (STI) 112, 114, 116 may be formed for delineating active regions 110a and 110b in a surface region close to the upper surface of the semiconductor substrate 100. Although details on the formation of the STI regions 112, 114 and 116 are omitted for the sake of brevity, the person skilled in the art will appreciate that known processes for forming STI regions may be employed when forming the STI regions 112, 114 and 116. For example, an appropriate masking pattern may be formed, e.g., by employing known lithography techniques wherein a masking pattern (not illustrated) or patterned hard mask (not illustrated) is formed over the upper surface of the semiconductor substrate 100, leaving surface regions of the semiconductor substrate 100 exposed to further processing. Next, an etching process, as known in the art, for forming trenches of STI structures is performed for anisotropically etching trenches into the semiconductor substrate along the depth direction (perpendicular to the upper surface of the semiconductor substrate) in alignment with the patterned hard mask (not illustrated) or masking pattern (not illustrated). Then, the accordingly formed trenches (not illustrated) may be filled with an insulating material, such as silicon oxide. Subsequently, an optional planarization step (e.g., by CMP) may be performed and the semiconductor device as illustrated in FIG. 2i may be obtained.

Figure 2J:
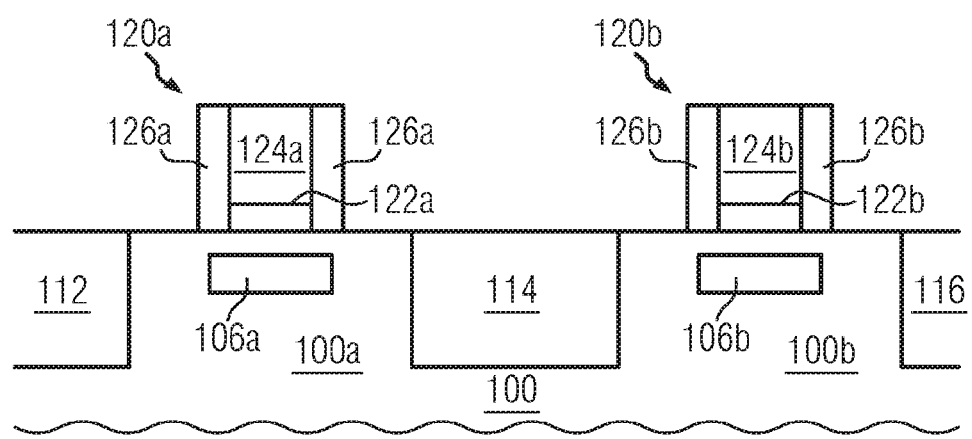

Next, as illustrated in FIG. 2j, a first gate structure 120a and a second gate structure 120b is formed over the respective one of the active regions 100a and 100b. Each of the gate structures 120a, 120b comprises a corresponding gate oxide 122a, 122b and a corresponding gate electrode 124a, 124b. The person skilled in the art will appreciate that at least one of the gate oxides 122a, 122b may comprise a high-k material layer such as a hafnium comprising material layer (e.g., hafnium oxide, hafniumoxynitride and the like), and one or more layers of work function adjusting materials, e.g., TiN and the like. At least one of the gate electrodes 124a, 124b may be formed by one of polysilicon, amorphous silicon and an appropriate metal material.

The person skilled in the art will appreciate that at least one of the gate structures 120a, 120b may represent a dummy gate structure when implementing a gate-last process or may comprise the final gate oxide structure together with a dummy gate electrode for implementing a hybrid gate-last process. Alternatively or additionally, at least one of the gate structures 120a, 120b may be formed in accordance with common gate-first techniques.

In accordance with some illustrative embodiments of the present disclosure, sidewall spacers 126a, 126b may be formed adjacent to the respective gate structures 120a, 120b.

Figure 2K:
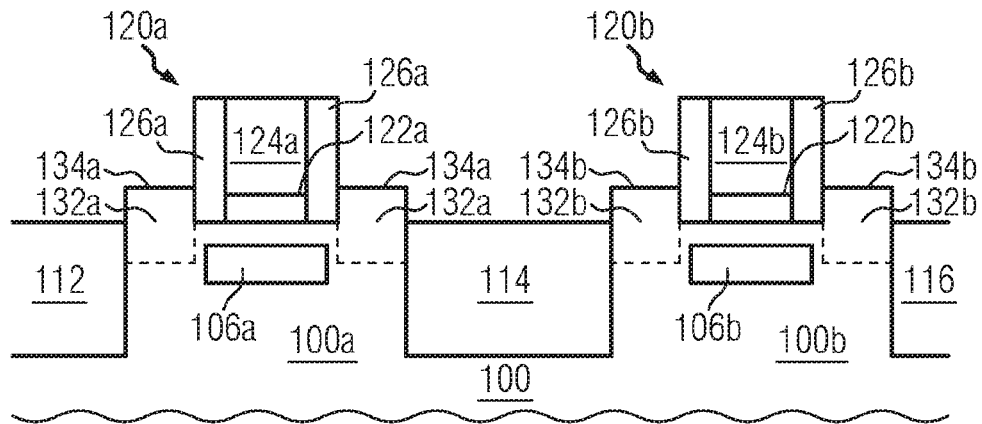

Next, as illustrated in FIG. 2k, source/drain regions 132a may be formed in the active region 100a in alignment with the gate structure 120a. Accordingly, source/drain regions 132b may be formed in the active region 100b in alignment with the gate structure 120b. As illustrated, the source/drain regions 132a, 132b may (optionally) comprise raised source/drain regions 134a, 134b. The person skilled in the art will appreciate that the formation of raised source/regions 134a, 134b may be achieved by depositing appropriately doped semiconductor material on upper exposed surfaces of the active regions 100a, 100b in FIG. 2j adjacent to the gate structures 120a, 120b. Additionally or alternatively, one or more implantation sequences may be performed for implanting source/drain dopants into the source/drain regions 132a, 132b. The person skilled in the art will appreciate that source/drain extension regions and/or hollow regions and/or deep source/drain regions may be formed in the source/drain regions 132a, 132b, although this is not explicitly illustrated.

In accordance with some illustrative embodiments of the present disclosure, the sidewall spacers 126a, 126b may define a lateral separation between the source/drain region 132a and the buried insulating material region 106a in the active region 100a and between the source/drain region 132b and the buried insulating material region 106b in the active region 100b. That is, in case that a lateral length of the gate electrode 124a, 124b together with a lateral length of the sidewall spacers 126a, 126b is greater than a lateral extension of the buried insulating material region 106a, 106b, the buried insulating material region 106a may be disposed in between the source/drain regions 132a, 132b without having physical contact with the source/drain regions 132a, 132b. In case that a total length of each of the gate structures 120a, 120b, that is, a length of each of the gate electrodes 124a, 124b plus the respective sidewall spacer 126a, 126b, is smaller than a lateral extension of each of the buried insulating material regions 106a, 106b, each of the buried insulating material regions 106a, 106b may define a lateral separation between the source/drain regions 132a, 132b in at least partially laterally abutting against the source/drain regions 132a, 132b.

Figure 2L:
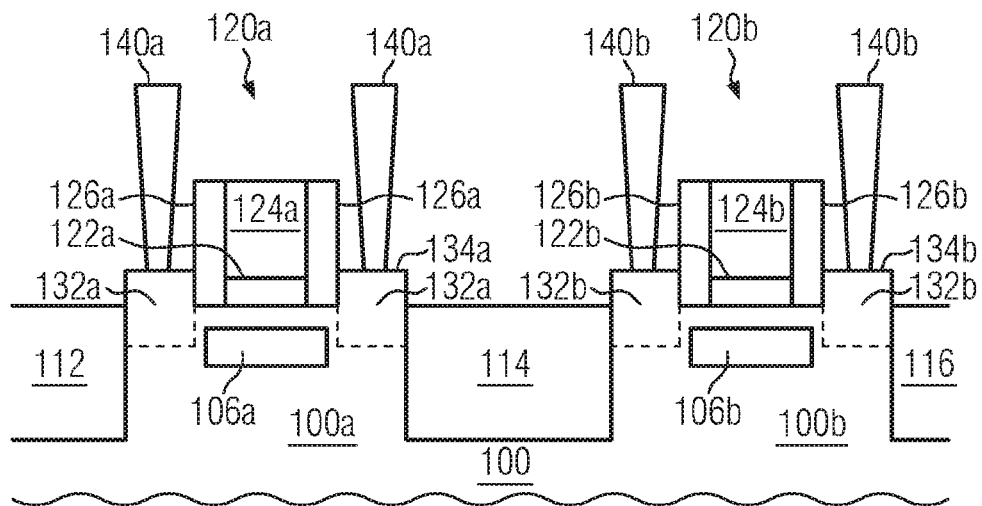

Next, as illustrated in FIG. 2l, source/drain contacts 140a, 140b may be formed to the respective source/drain regions 132a, 132b in accordance with conventional contact formation techniques. The person skilled in the art is readily aware of according techniques for forming the source/drain contacts 140a, 140b and details hereon are omitted for the sake of brevity.

As illustrated in FIG. 2l, semiconductor devices having thin channels bordering thin insulating material regions buried into active regions may be formed, wherein the thickness of the buried insulating material regions may be adjusted to desired values. Furthermore, the buried insulating material region may be formed and structured in accordance with desired thickness and layout schemes. In accordance with some illustrative examples herein, the burying of the insulating material regions may be achieved by means of solid state epitaxy or solid phase epitaxy (SPE) to form channels for fully depleted semiconductor devices. The person skilled in the art will appreciate that no SOI wafer is required to implement FD semiconductor devices. That is, it is possible to locally integrate FD devices on bulk semiconductor substrates. In accordance with special illustrative examples, BOX layers with tunable thickness may be provided such that multiple box thicknesses are possible.

The person skilled in the art will appreciate that FD devices are locally integrated by buried insulating material regions, easy body contacts may be further provided without adding complex additional steps to process flows and for avoiding floating body issues.

In accordance with some illustrative embodiments of the present disclosure, strain may be very easily incorporated into FD devices by, for example, employing SPE techniques, as disclosed herein.

In various aspects of the present disclosure, an insulating material layer may be deposited on a semiconductor material, the insulating material layer having a desired thickness. The deposited insulating material layer may be patterned to form a structured and patterned insulating material pattern. Next, an amorphous material may be deposited on the patterned and structured insulating material pattern. An optional cap layer may be formed on the patterned and structured insulating material pattern. Next, the amorphous material may be crystallized. The person skilled in the art will appreciate that FD devices may be formed without requiring an SOI wafer. It is possible to locally integrate FD devices on a buried insulating material layer with a desired thickness. For example, it is possible to provide buried insulating material layers with multiple thicknesses.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
an active region formed in a semiconductor substrate;
a gate structure disposed over said active region;
source/drain regions formed in said active region in alignment with said gate structure; and
a buried insulating material region disposed in said active region under said gate structure, wherein said buried insulating material region is surrounded by said active region and borders a channel region in said active region below said gate structure along a depth of said active region, said source/drain regions having a depth greater than a top surface of said buried insulating material region.

2. The semiconductor device of claim 1, wherein said buried insulating material region is formed of silicon oxide.

3. The semiconductor device of claim 1, wherein said buried insulating material region is located at a depth in a range from about 10-20 nm in said active region.

4. The semiconductor device of claim 1, wherein said buried insulating material region has a lateral dimension extending between said source/drain regions of about at most 40 nm.

5. The semiconductor device of claim 1, wherein said buried insulating material region has a thickness of less than about 20 nm.

6. The semiconductor device of claim 1, wherein said buried insulating material region is partially enclosed by silicon germanium material for imposing stress on said channel region.

7. A semiconductor device, comprising:
an active region formed in a semiconductor substrate;
a gate structure disposed over said active region;

source/drain regions formed within said active region in alignment with said gate structure; and a buried insulating material region disposed in said active region under said gate structure at a depth in a range from about 10-20 nm in said active region, wherein said buried insulating material region laterally abuts against said source/drain regions and defines a lateral separation between said source/drain regions of about at most 40 nm, said source/drain regions having a depth greater than a top surface of said buried insulating material region.

8. The semiconductor device of claim 7, wherein said buried insulating material region is formed of silicon oxide.

9. The semiconductor device of claim 7, wherein said buried insulating material region is partially enclosed by silicon germanium material for imposing stress on said channel region.

10. A semiconductor device, comprising:
an active region formed in a semiconductor substrate;
a gate structure disposed over said active region;
spacers defined on sidewalls of said gate structure;
source/drain regions formed in said active region in alignment with said gate structure; and
a buried insulating material region disposed in said active region under said gate structure, wherein said buried insulating material region is surrounded by said active region, wherein edges of said buried insulating material region disposed adjacent said source/drain regions are disposed beneath said spacers, said source/drain regions having a depth greater than a top surface of said buried insulating material region.

11. The semiconductor device of claim 10, wherein said buried insulating material region is formed of silicon oxide.

12. The semiconductor device of claim 10, wherein said buried insulating material region is located at a depth in a range from about 10-20 nm in said active region.

13. The semiconductor device of claim 10, wherein said buried insulating material region has a lateral dimension extending between said source/drain regions of about at most 40 nm.

14. The semiconductor device of claim 10, wherein said buried insulating material region has a thickness of less than about 20 nm.

15. The semiconductor device of claim 10, wherein said buried insulating material region is partially enclosed by silicon germanium material for imposing stress on said channel region.

* * * * *